United States Patent
Glass et al.

(10) Patent No.: US 8,896,066 B2
(45) Date of Patent: Nov. 25, 2014

(54) TIN DOPED III-V MATERIAL CONTACTS

(71) Applicant: Intel Corporation, Santa Clara, CA (US)

(72) Inventors: Glenn A. Glass, Beaverton, OR (US); Anand S. Murthy, Portland, OR (US); Michael J. Jackson, Portland, OR (US); Harold W. Kennel, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 13/685,369

(22) Filed: Nov. 26, 2012

(65) Prior Publication Data
US 2013/0154016 A1    Jun. 20, 2013

Related U.S. Application Data

(63) Continuation-in-part of application No. PCT/US2011/066132, filed on Dec. 20, 2011.

(51) Int. Cl.
*H01L 29/78* (2006.01)
*H01L 29/66* (2006.01)

(52) U.S. Cl.
CPC .......... *H01L 29/78* (2013.01); *H01L 29/66522* (2013.01)
USPC ........................................ 257/368

(58) Field of Classification Search
USPC ................. 257/368, 40, 57, 295, E21.009
See application file for complete search history.

(56) References Cited

U.S. PATENT DOCUMENTS

| | | | |
|---|---|---|---|
| 7,943,469 B2 | 5/2011 | Cook et al. | |
| 2005/0266654 A1 | 12/2005 | Hattendorf et al. | |
| 2007/0178642 A1 | 8/2007 | Kim et al. | |
| 2008/0124878 A1 | 5/2008 | Cook et al. | |
| 2008/0203432 A1 | 8/2008 | Kim | |
| 2011/0068407 A1* | 3/2011 | Yeh et al. | 257/369 |
| 2012/0187505 A1 | 7/2012 | Guo et al. | |
| 2013/0285155 A1 | 10/2013 | Glass et al. | |

FOREIGN PATENT DOCUMENTS

WO    2013095375 A1    6/2013

OTHER PUBLICATIONS

Office Action received for U.S. Appl. No. 13/976,074, mailed on Jan. 31, 2014, 13 pages.
Cooke, Mike. "Making III-V Contact with Silicon Substrates." Semiconductor Today. Compounds & Advanced Silicon. vol. 6. Issue 3. May 2011. 5 pages.

(Continued)

*Primary Examiner* — Cathy N Lam
(74) *Attorney, Agent, or Firm* — Finch & Maloney PLLC

(57) ABSTRACT

Techniques are disclosed for forming transistor devices having reduced parasitic contact resistance relative to conventional devices. The techniques can be implemented, for example, using a metal contact such as one or more metals/alloys on silicon or silicon germanium (SiGe) source/drain regions. In accordance with one example embodiment, an intermediate tin doped III-V material layer is provided between the source/drain and contact metal to significantly reduce contact resistance. Partial or complete oxidation of the tin doped layer can be used to further improve contact resistance. In some example cases, the tin doped III-V material layer has a semiconducting phase near the substrate and an oxide phase near the metal contact. Numerous transistor configurations and suitable fabrication processes will be apparent in light of this disclosure, including both planar and non-planar transistor structures (e.g., FinFETs, nanowire transistors, etc), as well as strained and unstained channel structures.

25 Claims, 11 Drawing Sheets

(56) References Cited

OTHER PUBLICATIONS

"Semiconductor." Wikipedia, the fre encyclopedia. Page last modified Nov. 13, 2011. Date accessed: Nov. 16, 2011. 11 Pages.

International Search Report & Written Opinion received for PCT Patent Application No. PCT/US2011/66132, mailed on Aug. 31, 2012 10 pages.

* cited by examiner

US 8,896,066 B2

TIN DOPED III-V MATERIAL CONTACTS

RELATED APPLICATION

This application is a continuation-in-part of PCT Application No. PCT/US2011/066132, filed Dec. 20, 2011, and entitled "III-V Layers for N-type and P-type MOS Source-Drain Contacts" which is herein incorporated by reference in its entirety.

BACKGROUND

Increased performance of circuit devices including transistors, diodes, resistors, capacitors, and other passive and active electronic devices formed on a semiconductor substrate is typically a major factor considered during design, manufacture, and operation of those devices. For example, during design and manufacture or forming of, metal oxide semiconductor (MOS) transistor semiconductor devices, such as those used in a complementary metal oxide semiconductor (CMOS), it is often desired to minimize the parasitic resistance associated with contacts otherwise known as external resistance $R_{ext}$. Decreased $R_{ext}$ enables higher current from an equal transistor design.

Figure 1A:
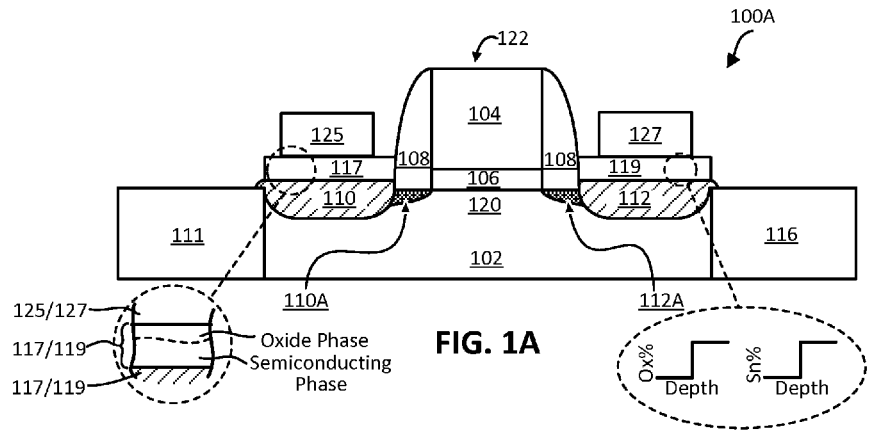
FIG. 1A illustrates a MOS device configured with a tin doped III-V material layer between the source/drain layer and contact metals, in accordance with an embodiment of the present invention.

As will be appreciated, the figures are not necessarily drawn to scale or intended to limit the claimed invention to the specific configurations shown. For instance, while some figures generally indicate straight lines, right angles, and smooth surfaces, an actual implementation of a transistor structure may have less than perfect straight lines, right angles, and some features may have surface topology or otherwise be non-smooth, given real world limitations of the processing equipment and techniques used. In short, the figures are provided merely to show example structures.

DETAILED DESCRIPTION

Techniques are disclosed for forming transistor devices having reduced parasitic contact resistance relative to conventional devices. The techniques can be implemented, for example, using a contact stack such as a series of metals on silicon or silicon germanium (SiGe) or III-V material source/drain regions. In accordance with one example such embodiment, an intermediate tin doped III-V material layer is provided between the source/drain and contact metals to significantly reduce contact resistance. Partial or complete oxidation of the tin doped layer can be used to further improve contact resistance. Numerous transistor configurations and suitable fabrication processes will be apparent in light of this disclosure, including both planar and non-planar transistor structures (e.g., FinFETs, nanowire transistors, etc), as well as strained and unstrained channel structures. The techniques are particularly well-suited for implementing n-type devices, but can be used for p-type devices if so desired.

General Overview

As previously explained, increased drive current in the transistors can be achieved by reducing device resistance. Contact resistance is one component of a device's overall resistance. A standard transistor contact stack typically includes, for example, a silicon or SiGe source/drain layer, a nickel silicide layer, a titanium nitride adhesion layer, and a tungsten contact/pad. In such configurations, the contact resistance is effectively limited by the silicon or SiGe valence band alignment to the pinning level in the metal. Typically, using industry standard silicides such as nickel (or other suitable silicides, such as titanium, cobalt, or platinum), this results in a band misalignment of about 0.5 eV. Employing small bandgap III-V contacts on silicon or SiGe source/drain layer can be used to lower contact resistance by virtue of lower energy barrier for electrons and small bandgap and high electron mobility. One process difficulty with such III-V material based contacts, however, is that oxides of III-V layers tend to be naturally insulating. In a typical manufacturing setting, this tendency for oxidation can be minimized via passivation processes with, for instance, sulfur or other stabilizing material(s) and/or minimizing time or atmospheric ambient between the time of finishing III-V deposition and contact layer deposition, but the oxidation concern is still present. In such cases, the natural oxide adds resistance and thereby degrades device performance.

Thus, and in accordance with an example embodiment of the present invention, an intermediate n-type III-V material layer doped with tin is provided between the source/drain and contact metals to significantly reduce contact resistance. The use of tin adds a significant potential option when the layer is partially or fully oxidized, in accordance with some embodiments. Specifically, the process actually improves conductivity and stabilizes the contact surface upon oxidation of the tin doped III-V material layer. In one specific case, the intermediate tin doped III-V material layer is implemented with indium tin oxide (InSnO). In some cases, surface layers may have tin concentrations much higher than required for simple doping (e.g., in the 0.1 to 15% range).

Subsequent oxidation in accordance with some embodiments can be used, for instance, to drive off excess group V materials such as arsenic, phosphor or antimony. In addition, subsequent oxidation can be used to react group III materials (e.g., such as indium or gallium, or even aluminum) and tin with oxygen to form InSnO or indium gallium tin oxide (InGaSnO) or gallium tin oxide (GaSnO). Note that indium or gallium generally perform better than aluminum. Further note that tin oxide behaves as a dopant in the oxide to increase its conductivity. At the same time, atomic tin in the III-V acts as an electron donor (dopant). In one specific example embodiment, tin is provided at a concentration between 1E17 cm$^{-3}$ and 1E21 cm$^{-3}$ in a semiconductor portion of the III-V material layer (or film) and near 10% in an oxide portion of the III-V film.

The thickness of semiconductor consumed by the oxidation process can vary as well, ranging from no oxidation of the tin doped III-V semiconductor layer to full conversion of the tin doped III-V semiconductor layer to oxide, including any fractional conversion of the tin doped III-V semiconductor layer to oxide so as to provide an oxide portion/phase of the layer and a semiconductor portion/phase of the layer. The tin concentration can vary proportionally with respect to the oxidation of the tin doped portion. In one example embodiment, most of the III-V film thickness remains semiconducting (e.g., very thin layer of oxidation after oxidation of the tin doped III-V film, such as a monolayer to 1 to 5 nanometers of oxidation). In another example embodiment, all of the III-V film is converted to oxide. For embodiments having a fractional or partial oxidation of the tin doped III-V semiconductor layer, the oxide portion/phase will be purely oxide and the semiconducting portion/phase will not contain oxygen to the extent possible. For instance, in some such example embodiments, the semiconductor portion/phase will have less than 1% oxygen and the oxide portion/phase will have about 45 atomic % or more oxygen.

The doping of the III-V layer can be carried out in a number of ways, including both in-situ and ex-situ doping techniques, so as to provide the desired conductivity (e.g., conductivity with values of for example 100 to 3000 S/cm). The doping level and techniques used can vary from one embodiment to another. At very high doping levels (e.g., greater than 1E17 atoms/cm$^3$ substitutional concentration), the amphoteric dopant contributes carriers in both valence and conduction bands, thereby increasing carrier concentration for both carrier types. Simulations show that by doping with tin, the Fermi level can be moved to its highest possible level and well into the conduction band, in some embodiments. This is true in the absence of any oxidation (i.e., in the semiconducting phase). A transmission electron microscopy (TEM) cross-section employing EELS composition analysis or secondary ion mass spectrometry (SIMS) profile can be used to show the III-V material concentration throughout the vertical stack of the film structure, as profiles of epitaxial alloys of silicon and SiGe (or other source/drain materials) can readily be distinguished from III-V semiconductor concentration profiles. Thus, transistor structures configured in accordance with embodiments of the present invention provide an improvement over conventional structures with respect to lower contact resistance.

Numerous transistor configurations and suitable fabrication processes will be apparent in light of this disclosure, including both planar and non-planar transistor structures (e.g., such as double-gate and trigate transistor structures), as well as strained and unstrained channel structures. Any number of such structural features and material systems can be used in conjunction with a tin doped III-V overlayer as described herein. The transistor structure may include, for example, n-type source/drain regions or both n-type and p-type source/drain regions. In some example embodiments, the transistor structure includes dopant-implanted source/drain regions or epitaxial (or poly) replacement source/drain regions of silicon, SiGe alloys, or nominally pure germanium films (e.g., such as those with less than 10% silicon), or III-V material in a MOS structure. In any such implementations, an overlayer or cap of tin doped III-V material can be formed directly over the source/drain regions, in accordance with an embodiment of the present invention. A contact metal (or series of metals) can then be deposited and a subsequent reaction (annealing) can be carried out to form metal source/drain contacts. As will be appreciated, the contact may be implemented as a stack including one or more of a resistance reducing metal, an adhesion layer, and/or a metal plug layer. The tin doped III-V overlayer can be formed directly over other parts of the transistor structure as well, such as the poly gate and/or grounding tap regions, if so desired.

As is known, a MOS transistor may include source and drain tip regions that are designed to decrease the overall resistance of the transistor while improving short channel effects (SCE). Conventionally, these tip regions are portions of the substrate where a dopant such as boron or phosphorous is implanted using an implant and diffusion technique. The source tip region is formed in the area between the source region and the channel region, and the drain tip region is formed in the area between the drain region and the channel region. Some embodiments of the present invention are configured with such tip regions. In still other example embodiments, an optional thin buffer with graded germanium concentration and/or boron concentration can be used as an interfacial layer between the underlying substrate and the source/drain layer (e.g., silicon or SiGe). Likewise, a thin buffer with graded germanium concentration and/or boron concentration can be used as an interfacial layer between the source/drain layer and the tin doped III-V film or cap. In still other embodiments, the source/drain layer themselves can have a graded germanium and/or phosphorous (or other dopant) concentration in a similar fashion as to the optional buffers. For various embodiments provided herein that are geared to NMOS applications, primary doping would be n-type. However, the optional tip regions may have some p-type halo counter doping, if so desired. In addition, the contact resistance is reduced from lowering of Schottky-barrier height. Still in other embodiments, the source/drain regions are entirely III-V material, rather than silicon or SiGe.

Architecture and Methodology

Each of FIGS. 1A, 1B, 1C, and 1D show example MOS device structures configured in accordance with an embodiment of the present invention. The devices may be, for example, planar transistor devices, with the depicted cross-section taken through the gate stack and channel area. Alternatively, the devices may be fin-based or multi-gate transistor devices, with the depicted cross-section taken parallel to and through the fin. The purpose of these example configurations is to show that the techniques described herein can be used with any number of planar and non-planar architectures as well as any number of source/drain region configurations. Each figure will now be discussed in turn.

FIG. 1A illustrates a MOS device 100A formed on a substrate 102 and configured with a tin doped III-V layer between the source/drain layer and contact metals, in accordance with an embodiment of the present invention. In particular, tin doped III-V layer 117 is provided between the source layer 110 and contact metals 125, and tin doped III-V layer 119 is provided between the drain layer 112 and contact metals 127. The source region 110 and the drain region 112 can be formed using any number of conventional techniques. In this example embodiment, for instance, the source region 110 and the drain region 112 are formed by etching the substrate 102 (or fin 102) and then epitaxially depositing a suitable source/drain material such as phosphorus doped silicon or silicon germanium material (e.g., with a phosphorous concentration of 5E20 cm$^{-3}$ and germanium concentration in the range of, for instance, 0 to 70 atomic %), or a III-V material (e.g., same material as providing at 117 and 119, or other suitable III-V compound material). Shallow trench isolation (STI) oxide 111 and 116 has also been provisioned, which may be, for example, silicon dioxide or other suitable insulator material capable of a dielectric constant suitable for the given application.

A gate stack 122 is formed over a channel region 120 of the transistor 100A. As can further be seen, the gate stack 122 includes a gate dielectric layer 106 and a gate electrode 104, and spacers 108 are formed adjacent to the gate stack 122. In some example cases, and depending on the technology node, the spacers 108 create a distance of about 3 to 20 nanometers (nm) between the edges of the gate dielectric layer 106 and the edges of each of the source and drain regions 110/112. It is within this space that a source tip region 110A and a drain tip region 112A can be formed. In this example embodiment, the tip regions 110A/112A are formed via an implantation-diffusion based process, and overlap the spacers 108 and may also overlap or underdiffuse the gate dielectric layer 106 by a distance of, for instance, less than 10 nm. In forming the implantation-diffusion based tip regions 110A/112A, a dopant such as boron, arsenic, phosphorous or other suitable dopant is implanted into the source region 110 and the drain region 112. The transistor 100A is then annealed to cause the dopant to diffuse towards the channel region 120. Angled ion implantation techniques may also be used to further implant dopants into those areas between the gate dielectric layer 106 and the source/drain regions 110/112.

In any case, and as will be appreciated in light of this disclosure, whether a transistor structure has a strained or unstrained channel, or source-drain tip regions or no source-drain tip regions, is not particularly relevant to various embodiments of the present invention, and the claimed invention is not intended to be limited to any particular such structural features. Rather, any number of transistor structures and types can benefit from employing a tin doped III-V film or overlayer as described herein. The techniques provided herein are compatible, for instance, with conventional dopant implanted silicon, raised source/drain, strained SiGe (or other suitable materials), and any deposited epitaxial tip (sometimes referred to as source-drain extensions) that extend below the gate electrode dielectric or are spaced away from the vertical line defined by the gate electrode dielectric.

The tin doped III-V overlayer 117/119 is generally provided after formation of the source/drain regions 110/112 and prior to formation of the contacts 125/127. The thickness of this overlayer 117/119 can vary from one embodiment to the next, but in one example embodiment is in the range of 10 to 250 Angstroms (Å). The tin concentration of the III-V material overlayer 117/119 can also vary from one embodiment to the next as well as within any one embodiment depending on the degree of optional oxidation, as will be discussed in turn. The overlayer 117/119 can be selectively deposited over the source/drain 110/112 regions (and/or other regions as desired, such as the poly gate or grounding tap regions or other such contact regions). Any number of suitable deposition techniques can be used to provide the overlayer 117/119 (e.g., chemical vapor deposition, molecular beam epitaxy, etc). In accordance with one example embodiment, the metal contacts 125/127 each comprise a stack a nickel, silver or other resistance reducing metal, a titanium nitride adhesion layer, and a tungsten plug, although any number of metal contact configurations can be used as will be appreciated in light of this disclosure. Standard deposition techniques can be used in providing the contact metals 125/127.

As will be appreciated in light of this disclosure, tin activates more strongly than other dopants such as germanium and silicon and can be used in doping a semiconducting phase of small gap III-V semiconductors such as alloys containing one or more of the group III elements (e.g., indium, gallium, aluminum) and/or one or more of the group V elements (e.g., antimony, arsenic, phosphorus). Specific examples of such small gap III-V semiconductors include, for instance, indium arsenide (InAs), indium antimonide (InSb), and gallium antimonide (GaSb). Small gap generally refers to compounds with a bandgap of less than 0.7 eV and in some such cases to compounds with bandgaps less than 0.25 eV. As will be further apparent in light of this disclosure, using tin as a dopant can be used eliminate or otherwise reduce the degradative effects that oxidation has on any semiconducting contact material. In more detail, there are costly controls that are generally used in practice to limit the extent of oxidation between the time that the semiconducting material is deposited or uncovered and the time that a contact metal is deposited. Any such oxide has a degrading effect on transistor current at a given voltage (e.g., saturation current, linear current, etc) because as a general rule, oxides of semiconductors are very resistive relative to unoxidized semiconductors. In a materials system configured in accordance with some embodiments of the present invention, a conductive oxide is intentionally provisioned with the layers 117/119. The amount of tin for the desired level of conduction in the oxide phase of the layer 117/119 can vary from one embodiment to the next, but in some example embodiments is in the range of 2.5 to 20% (e.g., ~10%). Note, however, that the tin concentration ratios of layers 117/119 can vary depending on the compounds used. For instance, if the 117/119 compound includes indium arsenide, a desired conductivity is predicted to occur in the semiconducting phase at a tin concentration of about 1E19 cm$^{-3}$, which means that roughly 0.03% of the compound is tin. To this end, the concentration of tin and oxidation depth of layers 117/119 may vary from one embodiment to the next, as will be appreciated in light of this disclosure.

For example, assume a device is fabricated with InAs:Sn or InSb:Sn (InAs or InSb doped with tin) layers 117/119 covering the S/D regions (or where the source/drain regions comprise InSb:Sn or InAs:Sn). Further assume that it is desirable for the entire layer 117/119 of InSb:Sn or InAs:Sn to be of the semiconducting phase. In some such example embodiments, the tin concentration is in the range of 0.003 to 1.0% (e.g., ~0.03%). In such cases, the preference would be no or negligible oxidation of the InAs, since its oxide is highly resistive. In another example case, assume a device is fabricated with InSnO (indium doped with tin and oxidized) covering the S/D regions (or where the source/drain regions comprise InSnO). In such an embodiment, it is possible to take advantage of the conductive InSnO film properties wherein the portion of the film 117/119 that is planned to be oxidized is alloyed to a much higher level of tin 2.5 to 20% (e.g., ~10%). Note in some cases, components of the initial deposition of III-V layer 117/119 may be evaporated and replaced with oxygen during the oxidation phase. For example, and in accordance with one example case, assume the goal for a given embodiment was to oxidize an entire layer 117/119 of InSb:Sn or InAs:Sn so as to convert it to ITO ($In_{2-2x}Sn_xO_3$ where x is approximately 0.1). In such a case, a set of anneal conditions could be selected to ensure that the antimony or arsenic is driven off while the indium and tin are oxidized to create InSnO with desired Sn concentrations in the oxide (e.g., about 10% tin, with about 50% oxygen and about 40% indium). As further shown in expanded views FIG. 1A, the extent of oxidation of layers 117/119 can be controlled to a particular depth of the III-V layer 117/119 itself, so as to provide an oxide phase of layer 117/119 and a remaining semiconducting phase of layer 117/119 (see expanded view on left of FIG. 1A). As will be further appreciated, the tin concentration can be tuned to match the oxidation depth, such that in some embodiments, as oxidation of layer 117/119 increases, the percentage of tin concentration also increases (see graphical annotations on right side of FIG. 1A). Alternatively, the layer 117/119 can be fully oxidized (without oxidizing any of the layers below layer 117/119). After this optional forced oxidation, the surface of layer 117/119 is generally stable to unintentional oxidation and no special measures are required to protect that surface between the oxidation phase and the subsequent deposition of contact metals.

The specific example embodiments in the previous paragraph include layers where either none (or an otherwise negligible portion) of the III-V 117/119 layer or all (or substantially all) of the III-V 117/119 layer thickness is oxidized. In other embodiments, it may be desirable to have a condition where, for example, the top surface of the III-V film/layer 117/119 is oxidized and the lower portion of the III-V film/layer 117/119 remains in the semiconducting phase. In such an embodiment, a III-V film/layer 117/119 where the tin concentration is low could be provided in the initial stages of deposition and then the tin concentration is high in the later stages of deposition. For example, the tin concentration can be graded from a low concentration (e.g., 0% to 4%) in the semiconducting phase of layer 117/119 to a higher concentration (e.g., 2.5% to 20%) in the oxide phase of layer 117/119. In some specific such embodiments, the tin concentration profile can be matched to a specific oxidation process condition to ensure that the tin concentration in the oxide phase of the III-V 117/119 layer is high (e.g., ~8% to 12%) while leaving behind a semiconducting phase of the III-V 117/119 layer where tin concentration is low (e.g., ~0.03%, or lower). These points with respect to oxidation and tin concentration can be applied to any embodiment provided herein, as will be appreciated.

Figure 1B:
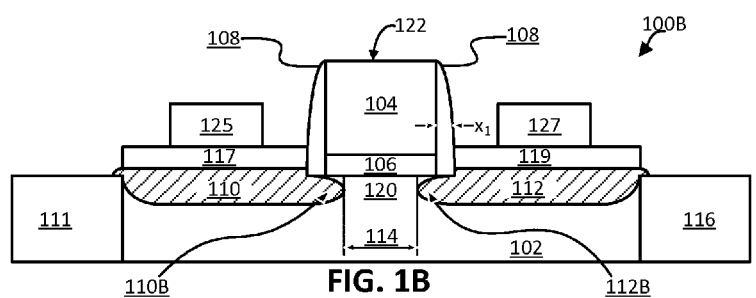
FIG. 1B illustrates a MOS device configured with a tin doped III-V material layer between the source/drain layer and contact metals, in accordance with another embodiment of the present invention.

FIG. 1B illustrates an example MOS device 100B formed on a substrate 102 and configured with STI oxide 111/116, and a tin doped III-V layer 117/119 between the source/drain layer 110/112 and contact metals 125/127, in accordance with another embodiment of the present invention. This example configuration includes source and drain epitaxial tips (generally referred to herein as epi-tips). In more detail, the MOS transistor 100B uses an undercut etch to allow the source region 110 and the drain region 112 to extend below the spacers 108, and in some cases, below the gate dielectric layer 106. The portions of the source/drain regions 110/112 that extend below the spacers 108 (and possibly the gate dielectric layer 106) are generally referred to as the source epi-tip 110B and the drain epi-tip 112B, respectively. The source and drain epi-tips 110B/112B replace the implantation/diffusion based tip regions 110A/112A described with regard to FIG. 1A. In accordance with one embodiment, the source/drain regions 110/112 and the source/drain epi-tips 110B/112B can be formed, for example, by etching the substrate 102 (or fin 102 if a fin-based architecture), which includes undercutting the spacers 108 (and possibly the gate dielectric layer 106), and then using selective epitaxial deposition to provide, for instance, an in-situ doped silicon, germanium, or SiGe to fill the source/drain regions 110/112 and the source/drain epi-tips 110B/112B, as shown in FIG. 1B. Note the epitaxial fill may be raised relative to the surface of substrate 102 (or fin 102), as further shown in FIG. 1B, although non-raised configurations can be used as well. The tin doped III-V overlayer 117/119 and the contact metals 125/127 can be implemented, for instance, as previously described with respect to FIG. 1A and that relevant discussion is equally applicable here.

Figure 1C:
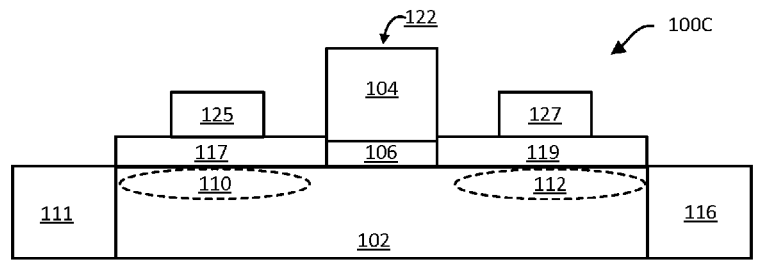
FIG. 1C illustrates a MOS device configured with a tin doped III-V material layer between the source/drain layer and contact metals, in accordance with another embodiment of the present invention.

FIG. 1C illustrates a MOS device 100C formed on a substrate 102 and configured with STI oxide 111/116, and tin doped III-V layers 117/119 between the respective source/drain layers 110/112 and contact metals 125/127, in accordance with another embodiment of the present invention. The source region 110 and the drain region 112 in this example embodiment are formed by implanting dopants such as boron into the substrate 102 (or fin 102). The gate stack 122 is formed over a channel region 120 of the transistor 100C and is this example case does not include sidewalls 108. Nor does this example transistor structure include an undercut or tip regions like the embodiments shown in FIGS. 1A and 1B. The tin doped III-V overlayer 117/119 and the contact metals 125/127 can be implemented, for instance, as previously described with respect to FIG. 1A and that relevant discussion is equally applicable here, as will be appreciated.

Figure 1D:
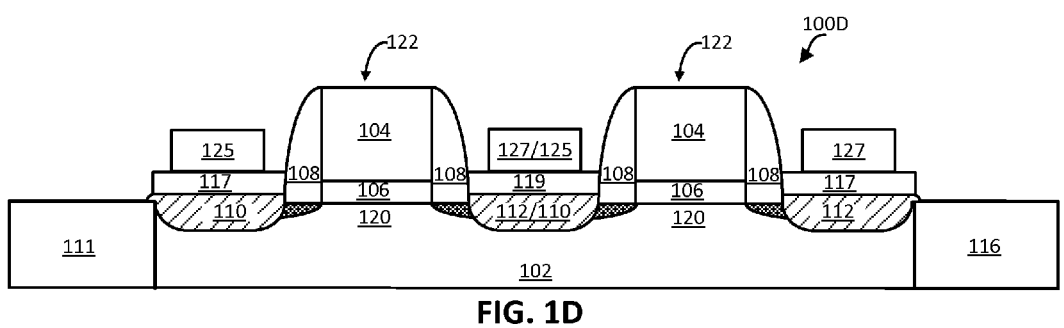
FIG. 1D illustrates a structure having a plurality of MOS devices configured with a tin doped III-V material layer between the source/drain layer and contact metals, in accordance with another embodiment of the present invention.

FIG. 1D illustrates a structure having a plurality of MOS devices each configured with a tin doped III-V material layer between the source/drain layer and contact metals, in accordance with another embodiment of the present invention. This example case demonstrates that the transistors can be provided in long rows with periodic breaks. The drain 112 of the left device and the source 110 of the right device are effectively the same element. Depending on how power is provided to these devices, the same element can be a source at one point and a drain the next. As can be further seen in this example embodiment, a tin doped III-V overlayer 117/119/117 is provided over the each of the source/drain regions, including the shared source/drain 110/112.

Numerous other variations and features can be implemented for transistor structures configured in accordance with an embodiment of the present invention. For example, a graded buffer may be used in one or more locations of the structure. For instance, the substrate 102 can be a silicon substrate, or a silicon film of a silicon on insulator (SOI) substrate, or a multi-layered substrate comprising silicon, silicon germanium, germanium, and/or III-V compound semiconductors. Thus, and by way of example, in an embodiment having a silicon or silicon germanium substrate 102 and an in-situ boron doped SiGe fill in the source/drain regions 110/112 and the source/drain epi-tips 110B/112B, a buffer can be provided between the underlying substrate 102 and the source/drain material. In one such embodiment, the buffer can be a graded phosphorous doped (or intrinsic) silicon or silicon germanium layer with the germanium concentration graded from a base level compatible with the underlying substrate up to 100 atomic % (or near 100 atomic %, such as in excess of 90 atomic % or 95 atomic % or 98 atomic %). The boron concentration within this buffer can be either fixed (e.g., at a high level) or graded, for instance, from a base concentration at or otherwise compatible with the underlying substrate up to a desired high concentration (e.g., in excess of $2E20$ $cm^{-3}$). Similar buffer configurations can be applied to fin-based and wire-based transistor configurations, as will be appreciated in light of this disclosure. Note that 'compatibility' as used herein does not necessitate an overlap in concentration levels (for instance, the germanium concentration of underlying substrate can be 0 to 20 atomic % and initial germanium concentration of the buffer can be 30 to 40 atomic %). In addition, as used herein, the term 'fixed' with respect to a concentration level is intended to indicate a relatively constant concentration level (e.g., the lowest concentration level in the layer is within 10% of the highest concentration level within that layer). In a more general sense, a fixed concentration level is intended to indicate the lack of an intentionally graded concentration level. The thickness of the buffer can vary depending on factors such as the range of concentrations being buffered, but in some embodiments is in the range of 30 to 120 Å, such as 50 to 100 Å (e.g., 60 Å or 65 Å). As will be further appreciated in light of this disclosure, such a graded buffer can be used to beneficially lower the Schottky-barrier height.

Alternatively, rather than using a thin buffer between the substrate 102 and the source/drain regions 110/112 and the source/drain epi-tips 110B/112B, the source/drain material itself can be graded in a similar fashion. For example, and in accordance with one example embodiment, phosphorous doped Si or SiGe source/drain regions 110/112 and the source/drain epi-tips 110B/112B can be configured with a germanium concentration graded from a base level concentration compatible with the underlying substrate (e.g., in the range of 30 to 70 atomic %) up to 100 atomic %. In some such embodiments, the boron concentration within this boron doped germanium layer can range, for example, from a base concentration at or otherwise compatible with the underlying substrate up to a desired high concentration (e.g., in excess of 2E20 $cm^{-3}$).

Alternatively, the source/drain regions 110/112 and the source/drain epi-tips 110B/112B (if present) can be implemented with III-V materials. In one such example case, the source/drain regions 110/112 are implemented with the same material as the tin doped III-V layers 117/119. However, other suitable III-V compounds can be used as well, as will be apparent in light of this disclosure.

Thus, a low contact resistance architecture for numerous transistor devices is provided. The devices may be formed in part using any number of conventional processes such as, for example, by gate oxide, poly gate electrode, thin spacer, and an isotropic undercut etch in the source/drain regions (or an ammonia etch to form faceted fin recess in monocrystalline substrate, or other suitable etch to form fin recess). In accordance with some embodiments, selective epitaxial deposition can be used to provide in-situ doped silicon or alternatively, a fully strained silicon germanium layer to form source/drain regions with or without tips. Optional buffers may be used as previously explained. Any suitable high-k replacement metal gate (RMG) process flow can also be used, where a high-k dielectric replaces the conventional gate oxide. Note that there is no silicide or germanide. Rather, any reaction is between the III-V material 117/119 and the contact metals 125/127. The techniques provided herein can be applied, for example, to benefit any technology nodes (e.g., 90 nm, 65 nm, 45 nm, 32 nm, 22 nm, 14 nm, and 10 nm transistors, and lower), and the claimed invention is not intended to be limited to any particular such nodes or range of device geometries. Other advantages will be apparent in light of this disclosure.

Figure 2:
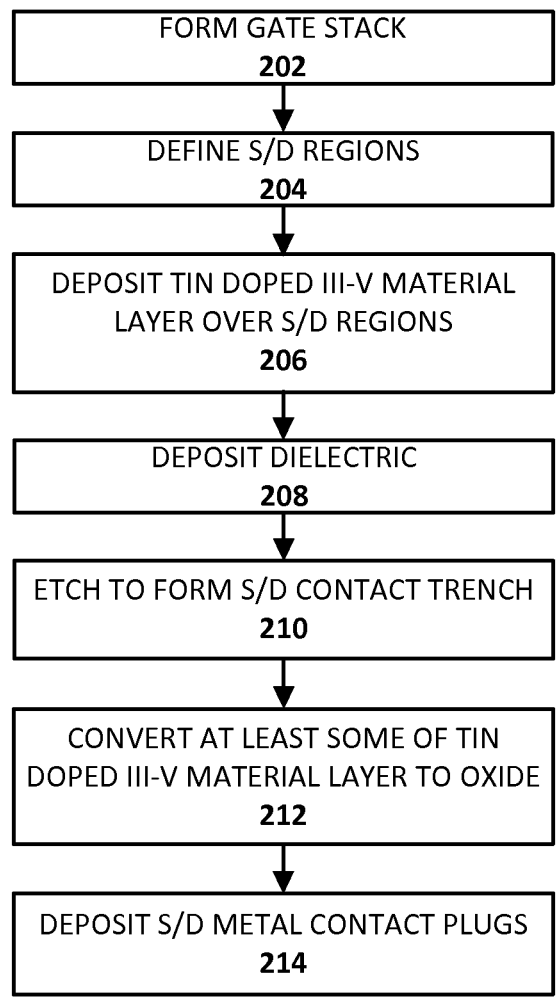
FIG. 2 is a method for forming a transistor structure with low contact resistance in accordance with an embodiment of the present invention.

FIG. 2 is a method for forming a transistor structure with low contact resistance in accordance with an embodiment of the present invention. FIGS. 3A through 3I illustrate example structures that are formed as the method is carried out, and in accordance with some embodiments.

Figure 3A:
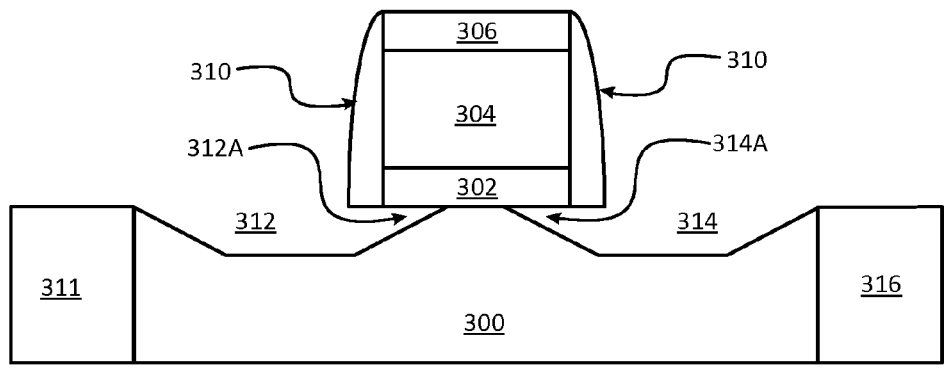
FIGS. 3A to 3I illustrate structures that are formed when carrying out the method of FIG. 2, in accordance with various embodiments of the present invention.

As can be seen, the method includes forming 202 a gate stack on a semiconductor substrate upon which a MOS device, such as an NMOS transistor, may be formed. The semiconductor substrate may be implemented, for example, with a bulk silicon or a silicon-on-insulator configuration. In other implementations, the semiconductor substrate may be formed using alternate materials, which may or may not be combined with silicon, such as germanium, silicon germanium, indium antimonide, lead telluride, indium arsenide, indium phosphide, gallium arsenide, or gallium antimonide. In a more general sense, any material that may serve as a foundation upon which a semiconductor device may be built or otherwise formed can be used in accordance with embodiments of the present invention. The gate stack can be formed as conventionally done or using any suitable custom techniques. In some embodiments of the present invention, the gate stack may be formed by depositing and then patterning a gate dielectric layer and a gate electrode layer. For instance, in one example case, a gate dielectric layer may be blanket deposited onto the semiconductor substrate using conventional deposition processes such as chemical vapor deposition (CVD), atomic layer deposition (ALD), spin-on deposition (SOD), or physical vapor deposition (PVD). Alternate deposition techniques may be used as well, for instance, the gate dielectric layer may be thermally grown. The gate dielectric material may be formed, for example, from materials such as silicon dioxide or high-k dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some specific example embodiments, the high-k gate dielectric layer may be between around 5 Å to around 200 Å thick (e.g., 20 Å to 50 Å). In general, the thickness of the gate dielectric layer should be sufficient to electrically isolate the gate electrode from the neighboring source and drain contacts. In further embodiments, additional processing may be performed on the high-k gate dielectric layer, such as an annealing process to improve the quality of the high-k material. Next, a gate electrode material may be deposited on the gate dielectric layer using similar deposition techniques such as ALD, CVD, or PVD. In some such specific embodiments, the gate electrode material is polysilicon or a metal layer, although other suitable gate electrode materials can be used as well. The gate electrode material, which is may be a sacrificial material that is later removed for a replacement metal gate (RMG) process, has a thickness in the range of 50 Å to 500 Å (e.g., 100 Å), in some example embodiments. A conventional patterning process may then be carried out to etch away portions of the gate electrode layer and the gate dielectric layer to form the gate stack, as shown in FIG. 3A. As can be seen, FIG. 3A illustrates a substrate 300 (or fin 300) upon which a gate stack is formed. In this example embodiment, the gate stack includes a gate dielectric layer 302 (which may be high-k gate dielectric material) and a sacrificial gate electrode 304. In one specific example case, the gate stack includes a silicon dioxide gate dielectric layer 302 and a polysilicon gate electrode 304. The gate stack may also include a gate hard mask layer 306 that provides certain benefits or uses during processing, such as protecting the gate electrode 304 from subsequent ion implantation processes. The hard mask layer 306 may be formed using typical hard mask materials, such as such as silicon dioxide, silicon nitride, and/or other conventional dielectric materials. FIG. 3A further illustrates spacers 310 formed on either side of the stack. The spacers 310 may be formed, for example, using conventional materials such as silicon oxide, silicon nitride, or other suitable spacer materials. The width of the spacers 310 may generally be chosen based on design requirements for the transistor being formed. In accordance with some embodiments, however, the width of the spacers 310 is not subject to design constraints imposed by the formation of the source and drain epi-tips, given sufficiently high boron doped germanium content in the source/drain tip regions, as described herein (note that boron won't diffuse into channel). This example embodiment further includes isolation regions 311/316, which may be shallow trench isolation (STI) oxide regions formed using conventional techniques, such as etching the substrate 300 to form trenches, and then depositing oxide material onto the trenches to form the STI regions. The isolation regions 311/316 can be made from any suitable dielectric/insulative material, such as $SiO_2$.

Figure 3B:
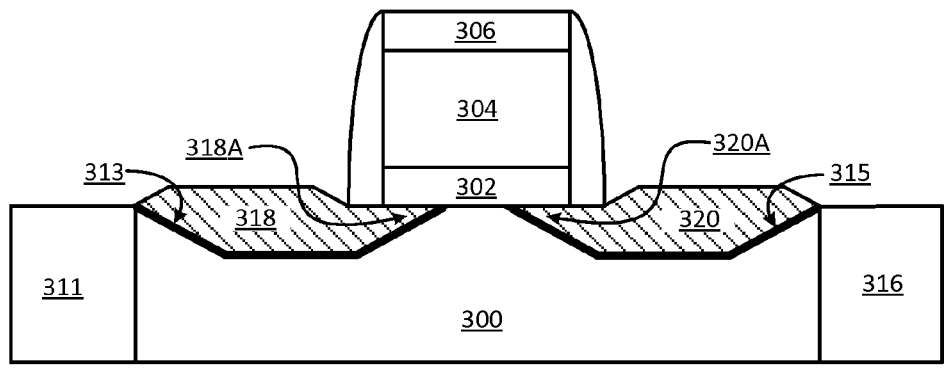

With further reference to FIG. 2, the method further includes defining 204 the source/drain regions of the transistor structure. As previously explained, the source/drain regions can be implemented with any number of suitable processes and configurations. For example, the source/drain regions may be implanted, etched and epi filled, raised, silicon or SiGe alloy, p-type and/or n-type, and have a planar or fin or wire shaped diffusion region. In the example embodiment shown in FIG. 3A, substrate 300 (which can be a planar substrate or a fin) has been etched to provide cavities 312/314 as well as respective tip areas 312A/314A which undercuts the gate dielectric 302. FIG. 3B illustrates the substrate 300 after cavities 312/314 and tip areas 312A/314A have been filled to provide the source/drain regions 318/320 and tip regions 318A/320A. In accordance with some example embodiments, the source and drain region cavities 312/314 along with their respective tip areas 312A/314A are filled with in-situ doped silicon or SiGe, thereby forming source region 318 (along with epi-tip 318A) and drain region 320 (along with drain epi-tip 320A). Any number of source/drain layer configurations can be used here, with respect to materials (e.g., silicon, SiGe, III-V materials, etc), dopant (e.g., boron, arsenic, phosphorous, or other suitable dopant), and dimension (e.g., thickness of source/drain layer may range, for instance, from 50 to 500 nm so as to provide a flush or raised source/drain region).

As previously explained, some such embodiments may include with a thin buffer between the source/drain layer and the substrate 300. For instance, and as can further be seen in the example embodiment shown in FIG. 3B, a source buffer 313 and a drain buffer 315 are deposited prior to depositing the source/drain materials. In some embodiments, the buffers 313 and 315 can be a graded boron doped silicon germanium layer with the germanium composition graded from a base level concentration compatible with the underlying substrate 300 material up to 100 atomic % (or near to 100 atomic % as previously described). The boron concentration can be appropriately graded as well. Other embodiments may also (or alternatively) include a buffer or graded composition between the source/drain regions 318/320 and the tin doped III-V overlayer 317/319 to facilitate a desired interface therebetween. Use of such buffers will depend on factors such as likeness of the respective material systems and bandgaps employed as well as desired performance (or desired degree of misfit dislocation). Numerous buffer schemes will be apparent in light of this disclosure.

Figure 3C:
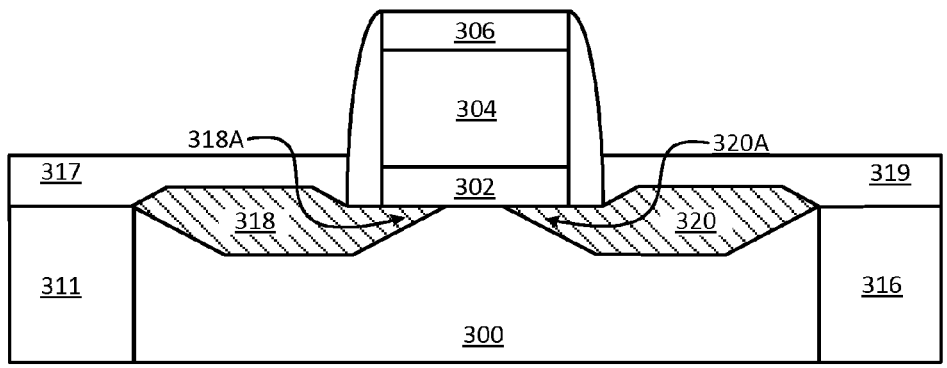

With further reference to FIG. 2, after the source/drain regions are defined, the method continues with depositing 206 tin doped III-V material on the source/drain regions of the transistor structure. FIG. 3C shows the tin doped III-V layer 317/319. In some example embodiments, the tin doped III-V layer 317/319, which may be epitaxially deposited in one or more layers, has a tin concentration in the 0.001% to 20% range, although other suitable concentration levels can be used as will be appreciated in light of this disclosure. As previously explained, this tin concentration may be fixed or effectively graded to provide a desired tin profile as well as a desired oxidation profile. For instance, in some embodiments it may be desired to have a condition where the top surface of the III-V layer 317/319 is oxidized and the lower portion of the III-V layer 317/319 remains in the semiconducting phase. In one specific such example case, the III-V layer 317/319 could have, for instance, a tin concentration that is relatively low in the initial stages of deposition (e.g., 0.0% to 0.1, such as about 0.03%) and relatively high in the later stages of deposition (e.g., 2.5% to 20.0%, such as about 10%). To this end, the tin concentration profile can be matched to a specific oxidation process condition to provide a desired tin concentration in the oxide phase and a relatively low tin concentration in a semiconducting phase.

In some example embodiments, the III-V material layer 317/319 is epitaxially deposited. The thickness of the III-V material layer 317/319 may be in the range, for example, of 10 to 250 Å, in accordance with some specific example embodiments, although other embodiments may have other layer thicknesses, as will be apparent in light of this disclosure. Any suitable deposition technique may be used for the depositing 206 or otherwise forming the III-V material layer 317/319. For example, the depositing 206 may be carried out in a CVD, or rapid thermal CVD (RT-CVD), or low pressure CVD (LP-CVD), or ultra-high vacuum CVD (UHV-CVD), or gas source molecular beam epitaxy (GS-MBE) tool using III-V material compounds, such as combinations of aluminum (Al), gallium (Ga), indium (In), phosphorus (P), arsenic (As), antimony (Sb), and/or precursors thereof. As previously explained, layer 317/319 can be deposited, for instance, with in-situ doping, diffusion doping, or implant doping such that it is tailored to the doping type of the underlying source/drain material. In one specific such example embodiment, the III-V material layer 317/319 is implemented with tin doped indium antimonide (InSb), at least some of which converts to InSnO after oxidation. In another specific such example embodiment, the III-V material layer 317/319 is implemented with tin doped indium arsenide (InAs), at least some of which converts to InSnO after oxidation. In another specific such example embodiment, the III-V material layer 317/319 is implemented with tin doped indium, at least some of which converts to InSnO after oxidation. In another specific such embodiment, the III-V material layer 317/319 is implemented with tin doped gallium arsenide (GaAs), at least some of which converts to GaSnO after oxidation. Numerous other conductive oxide portions of the III-V material layer 317/319 may be provisioned as generally described herein, such as indium gallium tin oxide (InGaSnO). The resulting tin concentration(s) can vary as previously explained (e.g., in some example cases, the resulting tin concentration multimodal in that it is in the range of $1E19$ $cm^{-3}$ and $1E21$ $cm^{-3}$ in the semiconductor portion of the III-V material layer 317/319 and in the range of 5% to 15% in an oxide portion of the III-V material layer 317/319). In any such embodiments, there may be a carrier gas such as, for instance, hydrogen, nitrogen, or a noble gas (e.g., precursor is diluted at 1-20% concentration with the balance being carrier gas). In some example cases, there may be an arsenic precursor such as arsine or TBA, a gallium precursor such as TMG, and/or an indium precursor such as TMI. There may also be an etchant gas such as, for example, halogen-based gas such as hydrogen chloride (HCl), chlorine (Cl), or, hydrogen bromide (HBr). The basic deposition of the III-V semiconductor material layer 317/319 is possible over a wide range of conditions using deposition temperature in the range, for example, of 300° C. to 700° C. (e.g., 400-500° C.) and reactor pressure, for instance, in the range 1 Torr to 760 Torr. Each of the carrier and etchants can have a flow in the range of 10 and 300 SCCM (typically, no more than 100 SCCM of flow is required, but some embodiments may benefit from higher flow rates). In one specific example embodiment, the deposition 206 is carried out at a flow rate that ranges between 100 and 1000 SCCM.

As will be appreciated in light of this disclosure, the selectivity at which the III-V material layer 317/319 is deposited can vary as desired. In some cases, for instance, the III-V material layer 317/319 is deposited only on the source/drain regions or a portion of the source/drain regions (rather than across the entire structure). Any number of masking/patterning techniques can be used further define subset regions to selectively deposit layer 317/319. Moreover, other embodiments may benefit from layer 317/319 covering, for example, exposed poly gate regions or exposed grounding tap regions, and/or other areas where low contact resistance is desirable.

Figure 3D:
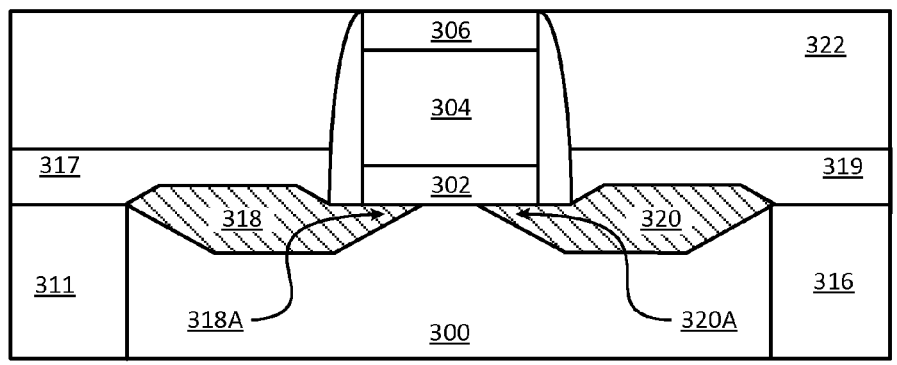

With further reference to FIG. 2, after the tin doped III-V material layer 317/319 is provided, the method continues with depositing 208 a dielectric over layer 317/319. FIG. 3D shows dielectric 322 as being flush with the hard mask 306 of the gate stack, but it need not be. The dielectric can be configured in a number of ways. In some embodiments, dielectric 322 is implemented with silicon dioxide ($SiO_2$) or other low-k dielectric materials. In other embodiments, dielectric 322 is implemented with a silicon nitride (SiN) liner followed by one or more layers of $SiO_2$, or any combination of nitride, oxide, oxynitride, carbide, oxycarbide, or other suitable dielectric materials. The dielectric 322, which may be referred to as an interlayer dielectric (ILD), may be planarized as commonly done. Other example dielectric materials include, for instance, carbon doped oxide (CDO), organic polymers such as perfluorocyclobutane or polytetrafluoroethylene, fluorosilicate glass (FSG), and organosilicates such as silsesquioxane, siloxane, or organosilicate glass. In some example configurations, the dielectric layer 322 may include pores or other voids to further reduce or otherwise adjust its dielectric constant to a desired level.

Figure 3E:
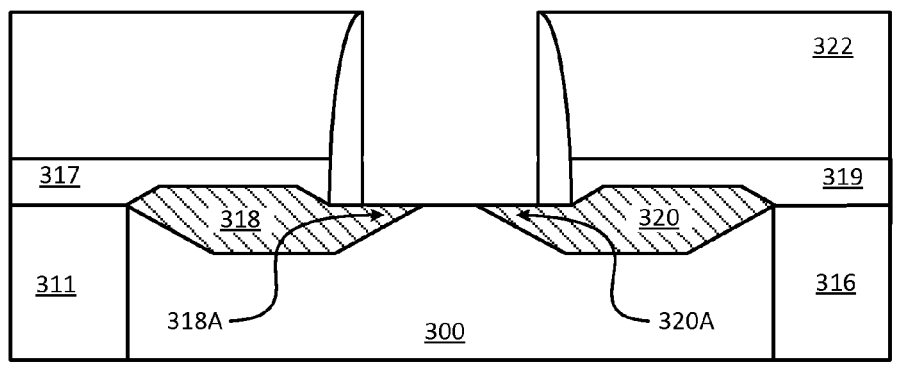
Figure 3F:
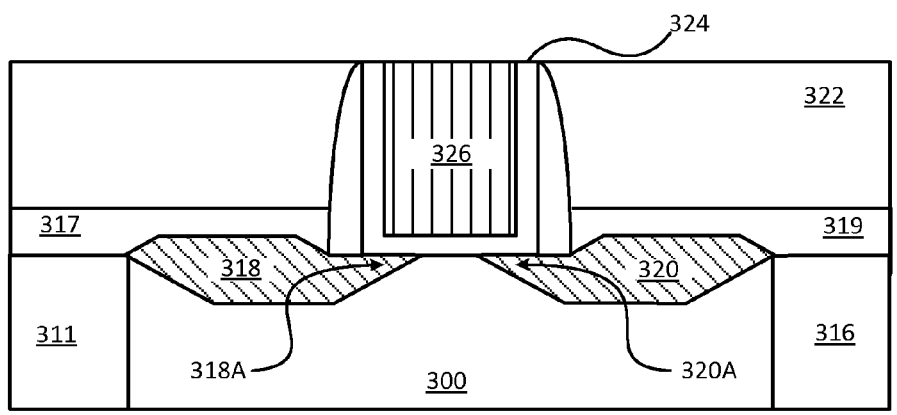

Next, in some embodiments of the present invention where a replacement metal gate (RMG) process is used and as best shown in FIG. 3E, the method may further include removing the gate stack (including the high-k gate dielectric layer 302, the sacrificial gate electrode 304, and the hard mask layer 306) using an etching process as conventionally done. In alternate implementations, only the sacrificial gate 304 and hard mask layer 306 are removed. FIG. 3E illustrates the trench opening that is formed when the sacrificial gate stack is etched away, in accordance with one such embodiment. If the gate dielectric layer is removed, the method may continue with depositing a new gate dielectric layer into the trench opening (designated as 324 in FIG. 3F). Any suitable high-k dielectric materials such as those previously described may be used here, such as hafnium oxide. The same deposition processes may also be used. Replacement of the gate dielectric layer may be used, for example, to address any damage that may have occurred to the original gate dielectric layer during application of the dry and wet etch processes, and/or to replace a low-k or sacrificial dielectric material with a high-k or otherwise desired gate dielectric material. As further shown in FIG. 3F, the method may further continue with depositing the metal gate electrode layer 326 into the trench and over the gate dielectric layer 324. Conventional metal deposition processes may be used to form the metal gate electrode layer, such as CVD, ALD, PVD, electroless plating, or electroplating. The metal gate electrode layer may include, for example, workfunction metal, such as ruthenium, palladium, platinum, titanium, titanium nitride, tantalum, tantalum nitride, cobalt, nickel, aluminum, and conductive metal oxides, e.g., ruthenium oxide. In some example configurations, two or more metal gate electrode layers may be deposited. For instance, a workfunction metal may be deposited in the gate trench followed by a suitable metal gate electrode fill metal such as aluminum or silver.

Figure 3G:
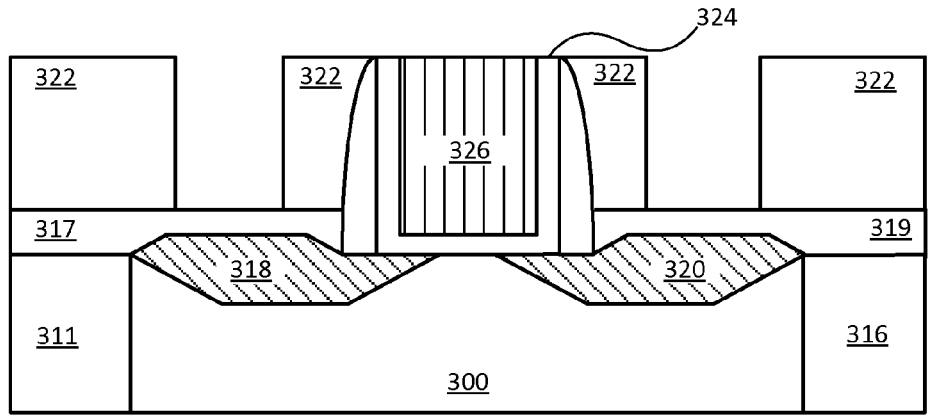

With further reference to FIG. 2, after dielectric layer 322 is provided over layer 317/319 (and any desired RMG process), the method continues with etching 210 to form the source/drain contact trenches. Any suitable dry and/or wet etch processes can be used. FIG. 3G shows the source/drain contact trenches after etching is complete, in accordance with one example embodiment.

The method of this example embodiment then continues with converting 212 at least some of the tin doped III-V material layer 317/319 (exposed by the trench etch at 210) to oxide. This can be accomplished, for example, using any number of suitable oxidation anneal processes such as flash anneal, laser anneal, rapid thermal anneal (for signal wafer process equipment) or a vertical diffusion furnace anneal (for batch process equipment). It can be done using so-called dry oxidation using, for instance, mixtures of gas containing oxygen ($O_2$) or nitrous oxide ($N_2O$), or so-called wet oxidation that employs water vapor in a carrier gas. Generally, the wet oxidation processes are more reactive and as such can be performed at lower temperatures for a given anneal time or shorter anneal times at a given temperature. A secondary process objective with respect to the converting performed at 212 is to drive off column V material (arsenic, antimony, arsenic oxide, antimony oxide) at the same time as performing the oxidation to the extent that such materials are present, and in accordance with some embodiments. As will be appreciated in light of this disclosure, these column V materials tend to have a high vapor pressure and can be desorbed during the oxidation provided the temperature is sufficiently high or they can be desorbed in a subsequent anneal process. As previously explained, it is desirable to remove the arsenic oxide and antimonide because such materials have poor electrical conductivity relative to indium tin oxide. As further previously explained, the depth of the oxidation can vary from one embodiment to the next, and may range from a partial oxidation of the exposed layer 317/319 (e.g., monolayer of oxidation to 10 nm of oxidation) to a substantially complete oxidation of the exposed layer 317/319 (e.g., 98% or more). In the case of a partial oxidation, an underlying portion of the exposed layer 317/319 will remain in its unoxidized semiconductor phase.

Figure 3H:
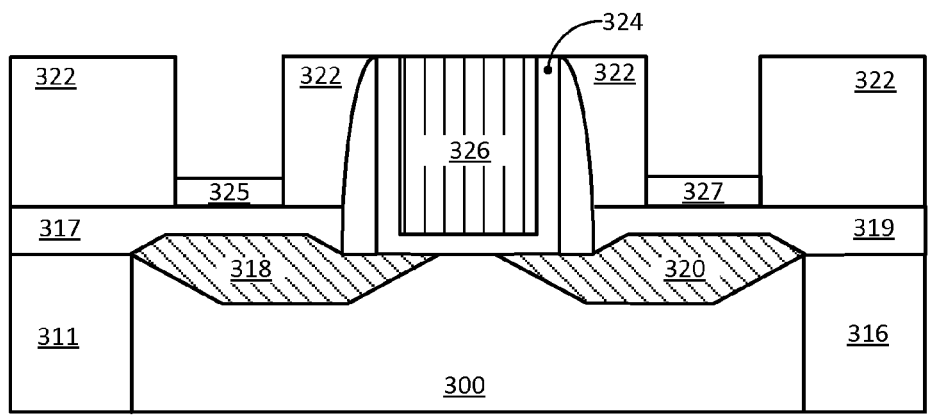
Figure 3I:
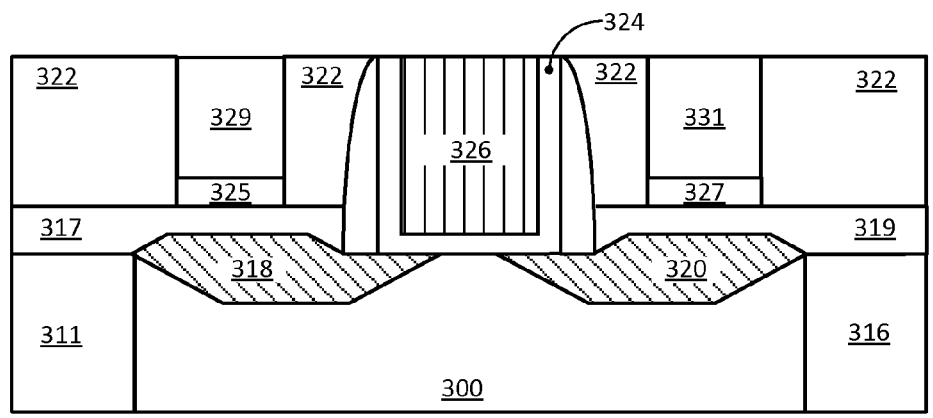

The method then continues with depositing 114 the source/drain contact plugs, which in some example embodiments may include the preliminary process of depositing a contact resistance reducing metal(s) and annealing, and then depositing a source/drain contact plug metal(s). FIG. 3H shows an example structure having contact resistance reducing metal(s) 325/327, and FIG. 3I shows the contact plug metal(s) 329/331. Note in such embodiments that there is no silicide or germanide. Rather, any reaction is between the III-V material layer 317/319 and the metallic contact resistance reduction layer 325/327. In some example such embodiments, the contact resistance reducing metal(s) 325/327 may include, for instance, nickel, platinum, cobalt, titanium, gold, nickel-platinum, and/or other such resistance reducing metals or alloys, and the contact plug metal(s) 329/331 may include, for instance, aluminum, tungsten, copper, titanium, silver, nickel-platinum or nickel-aluminum or any other suitably conductive contact metal or alloy. The contact metal(s) can be provisioned using any number of conventional deposition processes. Other embodiments may further include additional layers, such as adhesion layers between layer 317/319 and layer 325/327, and/or a protective layer on top of the contact plug, if so desired. In some example case, transistors having a source/drain configured with tin doped III-V material layer 317/319 at the interface between the source/drain regions and the contact resistance reducing layer 325/327, can exhibit resistivity values of less than 100 Ohm-um, and in some cases less than 90 Ohm-um, and in some cases less than 80 Ohm-um, and in some cases less than 70 Ohm-um, or lower.

Figure 4:
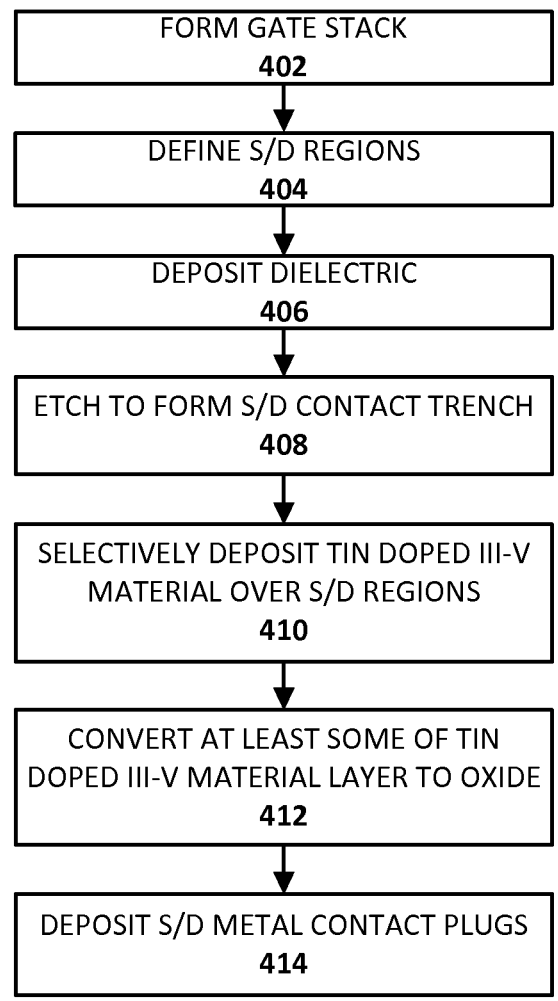
FIG. 4 is a method for forming a transistor structure with low contact resistance in accordance with another embodiment of the present invention.
Figure 5A:
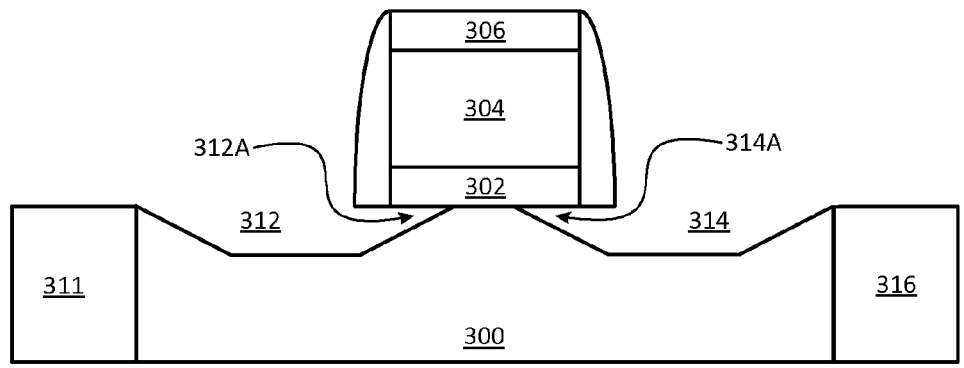
FIGS. 5A to 5F illustrate structures that are formed when carrying out the method of FIG. 4, in accordance with various embodiments of the present invention.
Figure 5B:
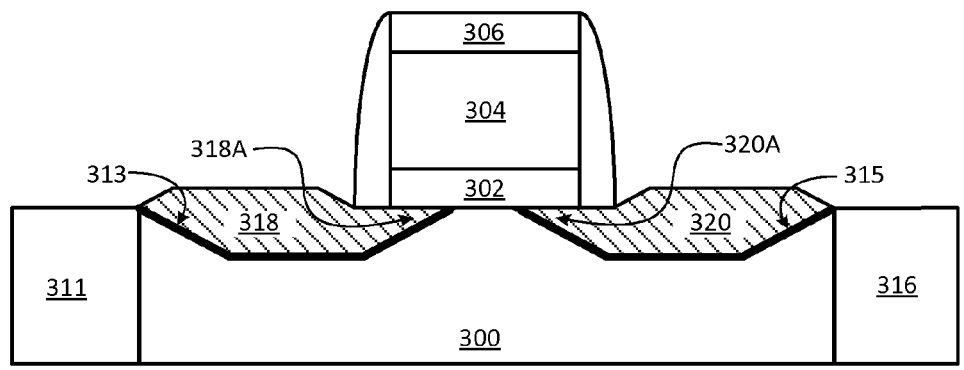
Figure 5C:
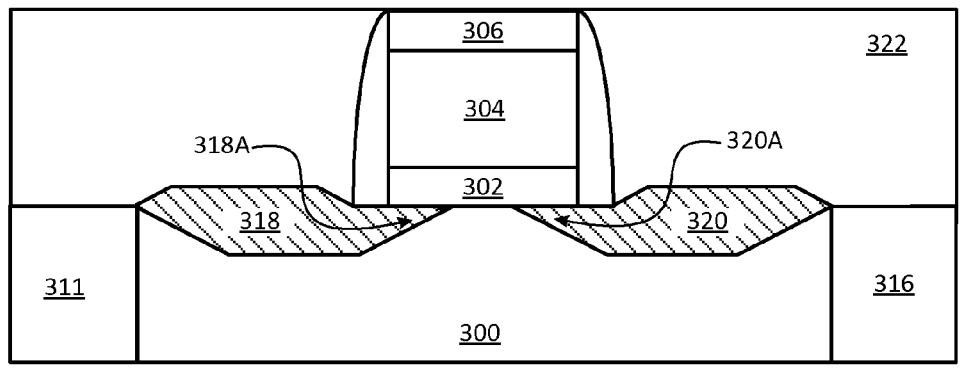
Figure 5D:
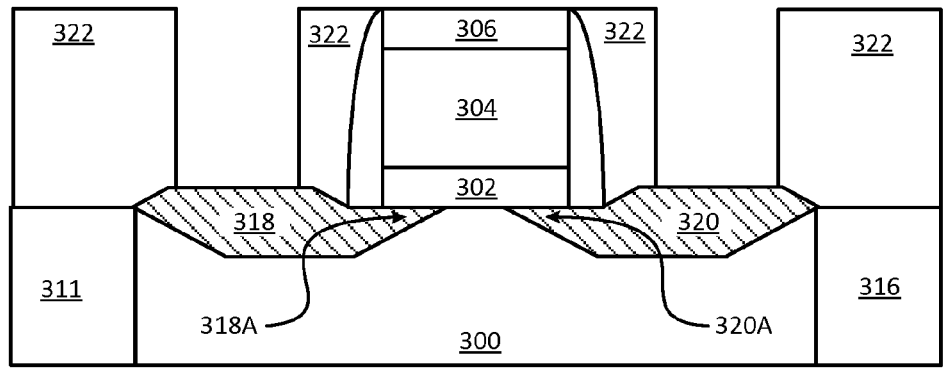
Figure 5E:
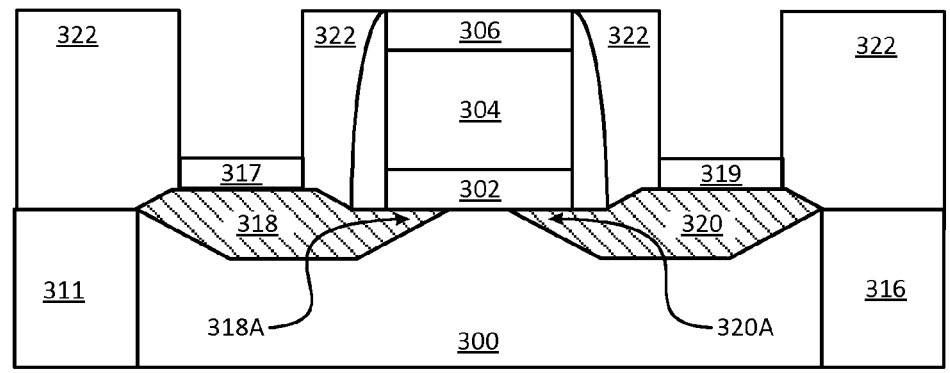
Figure 5F:
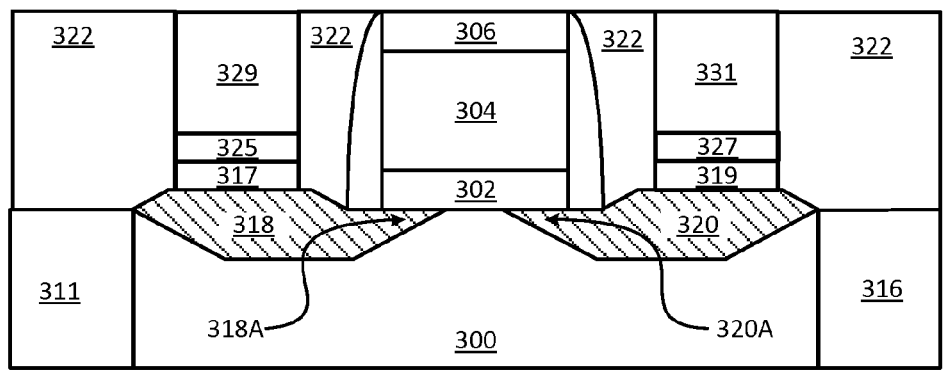

FIG. 4 is a method for forming a transistor structure with low contact resistance in accordance with another embodiment of the present invention. FIGS. 5A through 5F illustrate example structures that are formed as the method is carried out, and in accordance with some embodiments. In general, this method is similar to the method described with reference to FIGS. 2 and 3A-I, except that the deposition of the tin doped III-V layer 317/319 on the source/drain regions is carried out after the dielectric 322 is deposited and etched to form the contact trenches. Thus, the method includes forming 402 a gate stack and defining 404 the source/drain regions of the transistor structure (as shown in FIGS. 5A and 5B), which can be carried as previously discussed with reference to the forming 202 and defining 204 of FIG. 2 (and as shown in FIGS. 3A, and 3B), and continues with depositing 406 the dielectric 322 directly over the source/drain regions 318/320 (as shown in FIG. 5C). The method continues with etching 408 to form the source/drain contact trenches (as shown in FIG. 5D), and then selectively depositing 410 the tin doped III-V layer 317/319 into the trenches and directly onto the source/drain regions 318/320 (as shown in FIG. 5E). Depositing 410 can be carried out using any suitable deposition process, such as selective epitaxy. This example method includes optionally converting 412 at least some of the tin doped III-V material layer 317/319 to oxide, which can be carried as previously discussed with reference to the converting 212 FIG. 2. Recall that the converting 412 can be carried contemporaneously with the selectively depositing 410, so as to provide a desired oxide-semiconductor profile in the tin doped III-V material layer 317/319, where some or substantially all of the thickness of layer 317/319 can be converted to oxide. Further recall that the desired oxide-semiconductor profile can be achieved, for instance, by provisioning a III-V film/layer where the tin concentration is low in the initial stages of deposition and higher in the later stages of deposition. The example method of FIG. 4 continues with depositing 414 the source/drain contact plugs, which can also be carried as previously discussed with reference to the depositing 214 of FIG. 2. In this example embodiment, the contact metal stack includes contact reducing metal(s) 325/327 on top of layer 317/319 and contact plug metal(s) 329/331, as shown in FIG. 5F. This alternate methodology of FIG. 4 provides the same benefit of improved contact resistance, but is more selective in where the tin doped III-V material is deposited. Other such selective processes will be apparent in light of this disclosure, using any suitable combination of masking/patterning and selective deposition techniques.

Non-Planar Configuration

In some embodiments of the present invention, a non-planar architecture can be implemented, for instance, using FinFETs or nanowire configurations. A FinFET is a transistor built around a thin strip of semiconductor material (generally referred to as the fin). The transistor includes the standard field effect transistor (FET) nodes, including a gate, a gate dielectric, a source region, and a drain region. The conductive channel of the device resides on/within the outer sides of the fin beneath the gate dielectric. Specifically, current runs along and/or within both sidewalls of the fin (sides perpendicular to the substrate surface) as well as along and/or within the top of the fin (side parallel to the substrate surface). Because the conductive channel of such configurations essentially resides along/within the three different outer, planar regions of the fin, such a FinFET design is sometimes referred to as a tri-gate FinFET. Other types of FinFET configurations are also available, such as so-called double-gate FinFETs, in which the conductive channel principally resides only along/within the two sidewalls of the fin (and not along the top of the fin). A nanowire transistor (sometimes referred to as gate-all-around FET) is configured very similarly, but instead of a fin, a nanowire (e.g., silicon or SiGe or Ge nanowire) is used and the gate material generally surrounds the channel region on all sides. Depending on the particular design, nanowire transistors have, for instance, four effective gates. FIGS. 6A-6E each show a perspective view of an example non-planar architecture, configured in accordance with an embodiment of the present invention. Specifically, FIGS. 6A and 6B each shows a perspective view of a FinFET transistor structure and FIGS. 6C-6E show example nanowire channel transistor structures. Each of the figures will now be discussed in turn.

Figure 6A:
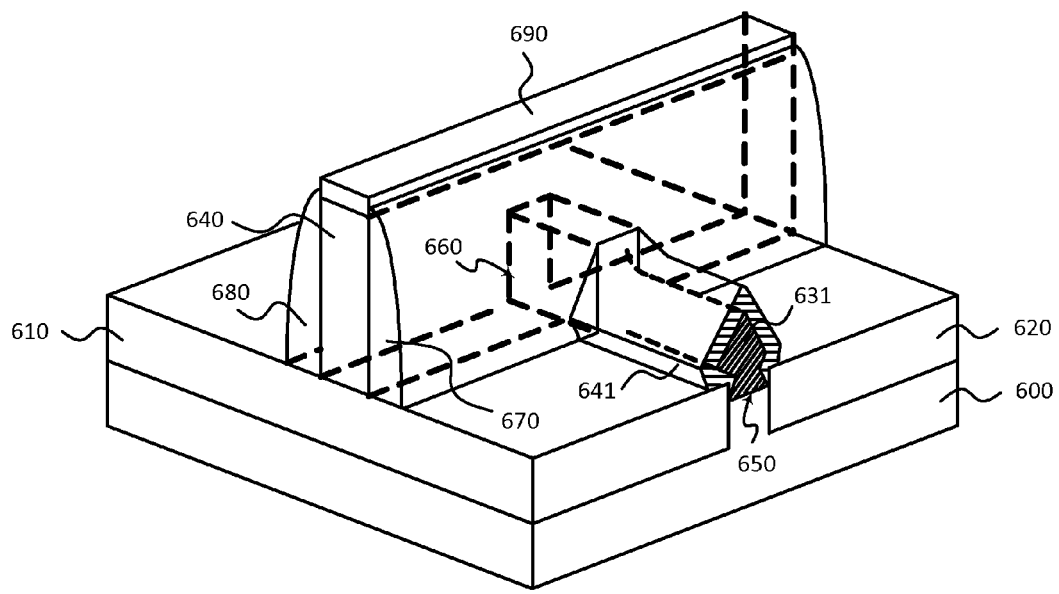
FIG. 6A-6E each shows a perspective view of a non-planar transistor architecture, configured in accordance with an embodiment of the present invention.

As can be seen, the example non-planar configuration shown in FIG. 6A is implemented with a tri-gate device which includes a substrate 600 having a semiconductor body or fin 660 extending from the substrate 600 through isolation regions 610/620. A gate electrode 640 is formed over three surfaces of the fin 660 to form three gates. A hard mask 690 is formed on top of the gate electrode 640. Gate spacers 670/680 are formed at opposite sidewalls of the gate electrode 640. A source region comprises the epitaxial region 631 formed on a recessed source interface 650 at one end/segment of fin 660, and a drain region comprises the epitaxial region 631 formed on a recessed source interface 650 at an opposing end/segment of fin 660 (not shown). A tin doped III-V material cap layer 641 is deposited over the source/drain regions 631. Note that the cap layer 641 may be provided in the recessed (tip) regions, but in other embodiments is just provided over the source/drain regions (and not in the recessed regions). In one embodiment, the isolation regions 610/620 are shallow trench isolation (STI) regions formed using conventional techniques, such as etching the substrate 600 to form trenches, and then depositing oxide material onto the trenches to form the STI regions. The isolation regions 610/620 can be made from any suitable dielectric/insulative material, such as $SiO_2$. The previous discussion with respect to the substrate 102 is equally applicable here (e.g., substrate 600 may be a bulk substrate, or a semiconductor-on-insulator substrate, or a multi-layered substrate).

As will be appreciated in light of this disclosure, conventional processes and forming techniques can be used to fabricate the FinFET transistor structure. However, and in accordance with one example embodiment of the present invention, the bilayer structure of the epitaxial region 631 and cap layer 641 can be implemented, for instance, using an in-situ doped silicon or SiGe (for 631) capped with a tin doped III-V film (for 641), with an optional semiconductor and/or dopant graded buffer between 631 and 641. As previously explained, such a buffer may be used to transition from a base level concentration compatible with the epitaxial region 631 to the tin doped III-V cap 641. Alternatively, concentration grading can be implemented directly in the epitaxial region 631 and/or the cap 641, rather than in an intervening graded buffer arrangement. As will further be appreciated, note that an alternative to the tri-gate configuration is a double-gate architecture, which includes a dielectric/isolation layer on top of the fin 660. Further note that the example shape of the source/drain regions 631 shown in FIG.

6A is not intended to limit the claimed invention to any particular source/drain types or formation processes, and other source/drain shapes will be apparent in light of this disclosure (e.g., round, square or rectangular p and n source/drain regions may be implemented, depending on the given application).

Figure 6B:
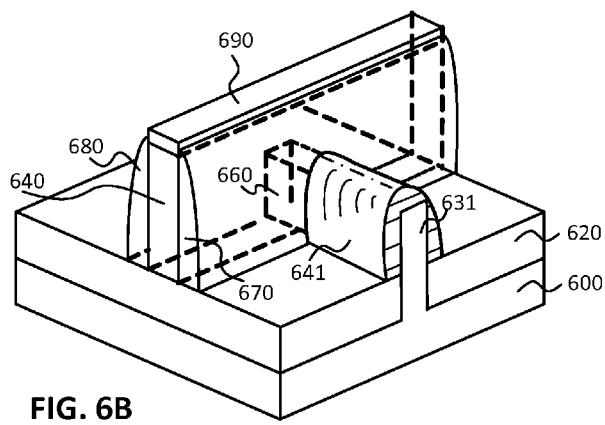
Figure 6C:
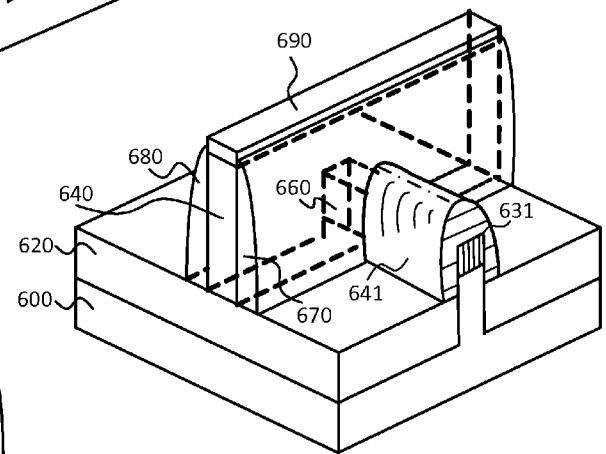
Figure 6D:
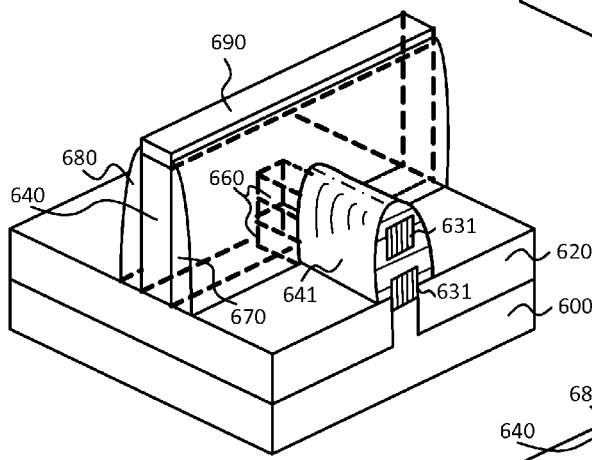
Figure 6E:
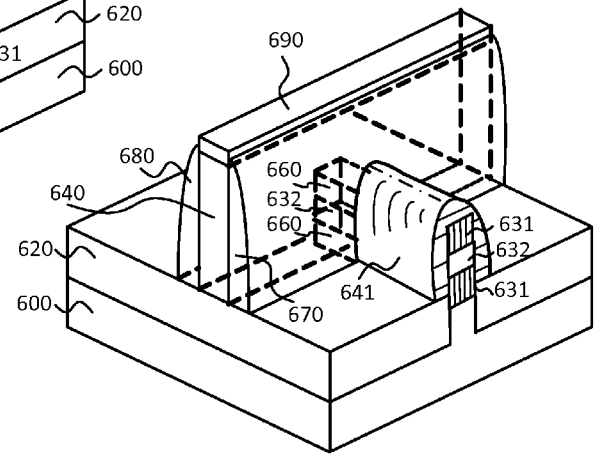

As will be further appreciated, the source/drain regions 631 shown in FIG. 6A were formed using a replacement process (e.g., etching, epitaxy deposition, etc). However, in other embodiments, source/drain regions 631 can be part of the fin 660 formed from the substrate 600 material itself, as best shown in FIG. 6B. Only one source/drain region 631 is shown, but numerous such regions can be implemented in a similar fashion (the techniques provided herein are particularly suitable for n-type S/D regions, but may be also applied to p-type S/D regions if so desired). A tin doped III-V material cap layer 641 is deposited over the source/drain regions 631 in a similar fashion as previously discussed with reference to FIG. 6A. Other relevant discussion provided with respect to FIG. 6A is also equally applicable here, as will be appreciated.

Another alternative is the nanowire channel architecture which may include, for example, a pedestal of substrate 600 material upon which a nanowire 660 (e.g., silicon or SiGe) is grown or otherwise provided, one example of which is shown in FIG. 6C. Similar to the fin structure shown in FIG. 6B, the nanowire 660 includes source/drain regions 631 (only one shown, but multiple such regions can be implemented, including n-type and/or even p-type, as previously explained. Just as with a fin structure, the source/drain regions 631 can be formed from substrate 600 material (from which the nanowires are fabricated) or one or more replacement materials (e.g., silicon or SiGe, InAs or InGaSb). The tin doped III-V material 641 can be provided, for instance, around all of the source/drain regions 631 of nanowire 660 or just a portion of the nanowire 660 (e.g., all except the portion on the pedestal).

FIG. 6D illustrates a nanowire configuration having multiple nanowires 660 (two in this example case). As can be seen, one nanowire 660 is provided in a recess of substrate 600 and the other effectively floats in the tin doped III-V material 641 layer. The corresponding source/drain regions 631 are shown with vertical cross-hatching, and may be p-type and/or n-type source/drain regions. FIG. 6E also illustrates a nanowire configuration having multiple nanowires 660, but in this example case, non-active material 632 is not removed from between the individual nanowires during the nanowire forming process, which can be carried out using various conventional techniques, as will be appreciated in light of this disclosure. Thus, one nanowire 660 is provided in a recess of substrate 600 and the other nanowire 660 effectively sits on top of the material 632. Note the nanowires 660 are active through the channel, but the 632 material is not. The tin doped III-V material 641 layer is provided around all other exposed surfaces of the nanowires 660. The corresponding source/drain regions 631 are again shown with vertical cross-hatching.

As previously explained, the tin doped III-V material 641 can be selectively converted to an oxide (e.g., to provide desired conductivity and drive off undesired components), so as to provide a desired oxide-semiconductor profile in the tin doped III-V material layer cap 641, where some or substantially all of the layer 641 is converted to oxide. As also previously explained, the desired oxide-semiconductor profile can be achieved, for instance, by provisioning a III-V film/layer where the tin concentration is low in the initial stages of deposition and higher in the later stages of deposition.

As will be further appreciated in light of this disclosure, a surrounding dielectric or insulator material (not shown) can be deposited on the substrate and effectively encase the gate electrode and fin structure. As previously explained, this dielectric/insulator material may be added in before or after provisioning of the tin doped III-V layer. In embodiments where it is added before, trenches can be opened in the insulator material to expose the source/drain areas to be contacted. Likewise, the contact metal(s) are not shown, but can be added in as typically done. In some embodiments, the contact metal layer can be deposited above the fin or wires, but in other cases it may wrap around the tin doped III-V layer as well. The contact layer may be oxidized, or not.

Example System

Figure 7:
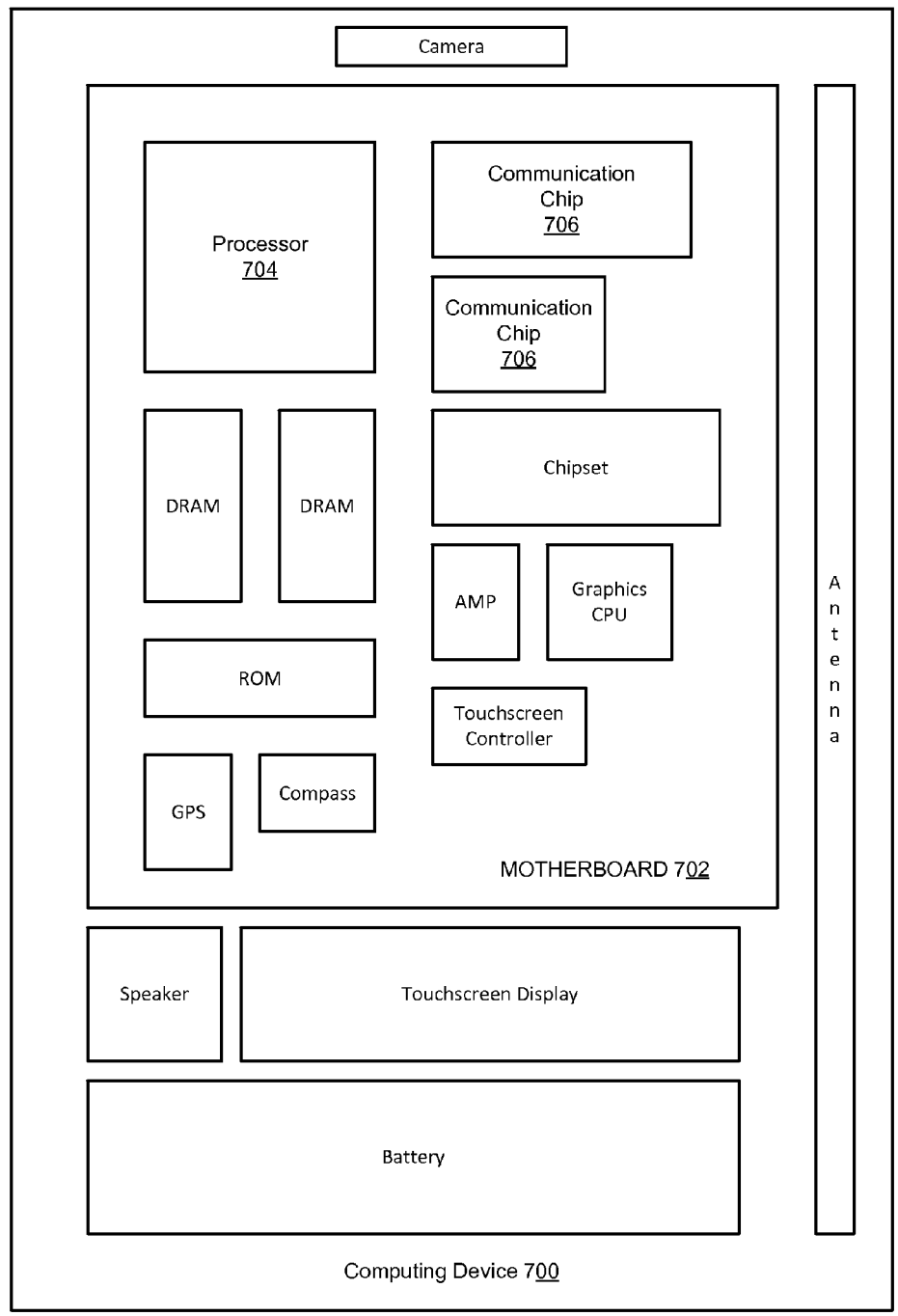
FIG. 7 illustrates a computing system implemented with one or more transistor structures in accordance with an example embodiment of the present invention.

FIG. 7 illustrates a computing device 700 configured in accordance with one embodiment of the invention. As can be seen, the computing device 700 houses a motherboard 702. The motherboard 702 may include a number of components, including but not limited to a processor 704 and at least one communication chip 706, each of which can be physically and electrically coupled to the motherboard 702, or otherwise integrated therein. As will be appreciated, the motherboard 702 may be, for example, any printed circuit board, whether a main board or a daughterboard mounted on a main board or the only board of device 700, etc. Depending on its applications, computing device 700 may include one or more other components that may or may not be physically and electrically coupled to the motherboard 702. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing device 700 may include one or more transistor structures as variously described herein. In some embodiments, multiple functions can be integrated into one or more chips (e.g., for instance, note that the communication chip 706 can be part of or otherwise integrated into the processor 704).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some embodiments of the present invention, the integrated circuit die of the processor includes an onboard non-volatile memory or cache, and/or is otherwise communicatively coupled to off-chip memory that is implemented with one or more transistor structures as variously described herein. The term "processor" may refer to any device or portion of a device that processes, for instance, electronic data from registers and/or memory to transform that electronic data into other electronic data that may be stored in registers and/or memory.

The communication chip 706 may also include an integrated circuit die packaged within the communication chip 706. In accordance with some such example embodiments, the integrated circuit die of the communication chip includes one or more devices implemented with one or more transistor structures as variously described herein. As will be appreciated in light of this disclosure, note that multi-standard wireless capability may be integrated directly into the processor 704 (e.g., where functionality of any chips 706 is integrated into processor 704, rather than having separate communication chips). Further note that processor 704 may be a chip set having such wireless capability. In short, any number of processor 704 and/or communication chips 706 can be used. Likewise, any one chip or chip set can have multiple functions integrated therein.

In various implementations, the computing device 700 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the device 700 may be any other electronic device that processes data or employs transistors.

Numerous embodiments will be apparent in light of this disclosure, and features described herein can be combined in any number of configurations. One example embodiment of the present invention provides a semiconductor integrated circuit. The integrated circuit includes a substrate having a channel region, and a gate electrode above the channel region, wherein a gate dielectric layer is provided between the gate electrode and the channel region. The integrated circuit further includes source and drain regions in the substrate and adjacent to the channel region, and a tin doped III-V material layer on at least a portion of the source and drain regions. The integrated circuit further includes source and drain metal contacts on the III-V material layer. In some cases, at least a portion of the tin doped III-V material layer is oxidized. In some cases, a portion of the tin doped III-V material layer is oxidized, such that the source and drain metal contacts are in contact with the oxidized portion of the tin doped III-V material layer. In some cases, substantially all of the tin doped III-V material layer is oxidized. In some cases, the tin doped III-V material layer has a graded tin concentration. In some such cases, the tin doped III-V material layer has a tin concentration that is higher near the source and drain metal contacts than the tin concentration near the substrate. In other such cases, the tin doped III-V material layer has a semiconducting phase and an oxide phase. In some cases, the tin doped III-V material layer has a semiconducting phase and an oxide phase. In one such case, the tin doped III-V material layer has a tin concentration in the range of 0.003% to 1.0% in the semiconducting phase and in the range of 2.5% to 20% in the oxide phase. In some cases, the integrated circuit is implemented with a planar transistor architecture. In some cases, the device is implemented with a non-planar transistor architecture. For instance, in one such case, the non-planar transistor architecture comprises at least one of a fin-based transistor and/or a nanowire transistor. In some cases, the source/drain regions are n-type and comprise silicon or germanium or an alloy thereof, or a III-V material. Numerous variations will be apparent in light of this disclosure. For instance, another embodiment provides an electronic device that includes a printed circuit board having one or more integrated circuits as variously defined in this paragraph. In one such case, the one or more integrated circuits comprise at least one of a communication chip and/or a processor. In another such case, the device is a mobile computing device.

Another embodiment of the present invention provides a device. In this example embodiment, the device includes a silicon-containing substrate having a number of channel regions, and a gate electrode above each channel region, wherein a gate dielectric layer is provided between each gate electrode and a corresponding channel region. The device further includes n-type source/drain regions in the substrate and adjacent to a corresponding channel region, the n-type source/drain regions comprising silicon or germanium or an alloy thereof, or a III-V material. The device further includes a tin doped III-V material layer on at least a portion of the n-type source drain regions, and a metal contact on the tin doped III-V material layer for each of the n-type source/drain regions. In some cases, at least a portion of the tin doped III-V material layer is oxidized. In one such case, the source and drain metal contacts are in contact with an oxidized portion of the tin doped III-V material layer. In some cases, substantially all of the tin doped III-V material layer is oxidized. In some cases, the tin doped III-V material layer has a tin concentration that is higher near the source and drain metal contacts than the tin concentration near the substrate. In some cases, the tin doped III-V material layer has a semiconducting phase and an oxide phase. In one such case, the semiconducting phase has a tin concentration in the range of 0.003% to 1.0% and the oxide phase has a tin concentration in the range of 2.5% to 20%.

Another embodiment of the present invention provides a method for forming a semiconductor device. The method includes providing a substrate having a channel region, and providing a gate electrode above the channel region, wherein a gate dielectric layer is provided between the gate electrode and the channel region. The method further includes providing source/drain regions in the substrate and adjacent to the channel region, and providing a tin doped III-V material layer on at least a portion of the source/drain regions. The method further includes providing a metal contact on the tin doped III-V material layer. In some such example cases, the tin doped III-V material layer has a semiconducting phase near the substrate and an oxide phase near the metal contact, and the semiconducting phase has a tin concentration in the range of 0.003% to 1.0% and the oxide phase has a tin concentration in the range of 2.5% to 20%.

The foregoing description of example embodiments of the invention has been presented for the purposes of illustration and description. It is not intended to be exhaustive or to limit the invention to the precise forms disclosed. Many modifications and variations are possible in light of this disclosure. It is intended that the scope of the invention be limited not by this detailed description, but rather by the claims appended hereto.

What is claimed is:

1. A semiconductor integrated circuit, comprising:
   a substrate having a channel region;
   a gate electrode above the channel region, wherein a gate dielectric layer is provided between the gate electrode and the channel region;
   source and drain regions in the substrate and adjacent to the channel region;
   a tin doped III-V material layer on at least a portion of the source and drain regions, wherein the tin doped III-V material layer has a semiconducting phase and an oxide phase; and
   source and drain metal contacts on the III-V material layer.

2. The integrated circuit of claim 1 wherein at least a portion of the tin doped III-V material layer is oxidized.

3. The integrated circuit of claim 1 wherein a portion of the tin doped III-V material layer is oxidized, such that the source and drain metal contacts are in contact with the oxidized portion of the tin doped III-V material layer.

4. The integrated circuit of claim 1 wherein substantially all of the tin doped III-V material layer is oxidized, such that the semiconducting phase is relatively thin.

5. The integrated circuit of claim 1 wherein the tin doped III-V material layer has a graded tin concentration.

6. The integrated circuit of claim 5 wherein the tin doped III-V material layer has a tin concentration that is higher near the source and drain metal contacts than the tin concentration near the substrate.

7. The integrated circuit of claim 1 wherein the semiconducting phase has less than 1% oxygen and the oxide phase has 45 atomic % or more oxygen.

8. The integrated circuit of claim 1 wherein the oxide phase has a thickness in the range of a monolayer to 10 nm.

9. The integrated circuit of claim 1 wherein the tin doped III-V material layer has a tin concentration in the range of 0.003% to 1.0% in the semiconducting phase and in the range of 2.5% to 20% in the oxide phase.

10. The integrated circuit of claim 1 wherein the integrated circuit is implemented with a planar transistor architecture.

11. The integrated circuit of claim 1 wherein the integrated circuit is implemented with a non-planar transistor architecture.

12. The integrated circuit of claim 11 wherein the non-planar transistor architecture comprises at least one of a fin-based transistor and/or a nanowire transistor.

13. The integrated circuit of claim 1 wherein the source/drain regions are n-type and comprise silicon or germanium or an alloy thereof, or a III-V material.

14. An electronic device comprising:
   a printed circuit board having one or more integrated circuits as defined in claim 1.

15. The electronic device of claim 14 wherein the one or more integrated circuits comprise at least one of a communication chip and/or a processor.

16. The electronic device of claim 14 wherein the device is a mobile computing device.

17. A device, comprising:
   a silicon-containing substrate having a number of channel regions;
   a gate electrode above each channel region, wherein a gate dielectric layer is provided between each gate electrode and a corresponding channel region;
   n-type source/drain regions in the substrate and adjacent to a corresponding channel region, the n-type source/drain regions comprising silicon or germanium or an alloy thereof, or a III-V material;
   a tin doped III-V material layer on at least a portion of the n-type source drain regions, wherein the tin doped III-V material layer has a semiconducting phase and an oxide phase; and
   a metal contact on the tin doped III-V material layer for each of the n-type source/drain regions.

18. The device of claim 17 wherein at least a portion of the tin doped III-V material layer is oxidized.

19. The device of claim 17 wherein the source and drain metal contacts are in contact with the oxide phase of the tin doped III-V material layer.

20. The device of claim 17 wherein substantially all of the tin doped III-V material layer is oxidized, such that the semiconducting phase is relatively thin.

21. The device of claim 17 wherein the tin doped III-V material layer has a tin concentration that is higher near the source and drain metal contacts than the tin concentration near the substrate.

22. The device of claim 17 wherein the oxide phase has a thickness in the range of a monolayer to 10 nm.

23. The device of claim 17 wherein the semiconducting phase has a tin concentration in the range of 0.003% to 1.0% and the oxide phase has a tin concentration in the range of 2.5% to 20%.

24. A method for forming a semiconductor device, comprising:
   providing a substrate having a channel region;
   providing a gate electrode above the channel region, wherein a gate dielectric layer is provided between the gate electrode and the channel region;
   providing source/drain regions in the substrate and adjacent to the channel region;
   providing a tin doped III-V material layer on at least a portion of the source/drain regions, the tin doped III-V material layer having a semiconducting phase and an oxide phase; and
   providing a metal contact on the tin doped III-V material layer.

25. The method of claim 24 wherein the semiconducting phase is near the substrate and the oxide phase is near the metal contact, and the semiconducting phase has a tin concentration in the range of 0.003% to 1.0% and the oxide phase has a tin concentration in the range of 2.5% to 20%.

* * * * *